(12) United States Patent
Yamamoto

(10) Patent No.: US 10,707,227 B2
(45) Date of Patent: Jul. 7, 2020

(54) SEMICONDUCTOR DEVICE AND METHOD FOR MANUFACTURING THE SAME

(71) Applicant: TOSHIBA MEMORY CORPORATION, Minato-ku, Tokyo (JP)

(72) Inventor: Koichi Yamamoto, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/119,898

(22) Filed: Aug. 31, 2018

(65) Prior Publication Data

US 2019/0273089 A1 Sep. 5, 2019

(30) Foreign Application Priority Data

Mar. 2, 2018 (JP) .................................. 2018-037796

(51) Int. Cl.
| | |
|---|---|
| *H01L 29/788* | (2006.01) |
| *H01L 29/792* | (2006.01) |
| *H01L 27/11573* | (2017.01) |
| *H01L 27/1157* | (2017.01) |
| *H01L 27/11582* | (2017.01) |

(Continued)

(52) U.S. Cl.
CPC .. *H01L 27/11573* (2013.01); *H01L 21/76816* (2013.01); *H01L 21/76829* (2013.01); *H01L 21/76877* (2013.01); *H01L 23/5226* (2013.01); *H01L 23/5283* (2013.01); *H01L 23/53257* (2013.01); *H01L 23/53271* (2013.01);

(Continued)

(58) Field of Classification Search
CPC . H01L 27/115–11582; H01L 21/76816; H01L 21/76829; H01L 21/76877; H01L 23/5226; H01L 23/5283; H01L 23/53257; H01L 23/53271; H01L 23/53295; H01L 27/1157; H01L 27/11573; H01L 27/11582; H01L 27/11575
See application file for complete search history.

(56) References Cited

U.S. PATENT DOCUMENTS 8,193,571 B2 6/2012 Katsumata et al.
8,313,998 B2 11/2012 Satonaka et al.
(Continued)

FOREIGN PATENT DOCUMENTS

| JP | 2011-166061 A | 8/2011 |
| JP | 2012-094694 A | 5/2012 |
| JP | 5279403 B2 | 9/2013 |

*Primary Examiner* — Eric A. Ward
(74) *Attorney, Agent, or Firm* — Foley & Lardner LLP

(57) ABSTRACT

A semiconductor device includes a stacked body including conductive layers and first insulating layers which are alternately stacked. The stacked body includes, on at least one side thereof, a staircase portion having stairs formed from the conductive layers and the first insulating layers. A second insulating layer different in material from the first insulating layer is provided on an upper surface of the first insulating layer of the staircase portion. The second insulating layer is away from the conductive layer on the same first insulating layer. A third insulating layer is provided on the staircase portion. Contacts are provided in the first, second, and third insulating layers situated in the respective stairs of the staircase portion. The contacts lead from an upper surface of the third insulating layer to the conductive layer under the first insulating layer.

15 Claims, 11 Drawing Sheets

(51) Int. Cl.
*H01L 23/522* (2006.01)
*H01L 23/528* (2006.01)
*H01L 21/768* (2006.01)
*H01L 23/532* (2006.01)

(52) U.S. Cl.
CPC .... *H01L 23/53295* (2013.01); *H01L 27/1157* (2013.01); *H01L 27/11582* (2013.01)

(56) References Cited

U.S. PATENT DOCUMENTS

| | | | |
|---|---|---|---|
| 9,373,540 B2* | 6/2016 | Hyun | H01L 21/76843 |
| 2013/0234232 A1* | 9/2013 | Yahashi | H01L 21/768 |
| | | | 257/324 |
| 2014/0054789 A1* | 2/2014 | Chiu | H01L 27/1052 |
| | | | 257/774 |

* cited by examiner

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2018-037796, filed Mar. 2, 2018, the entire contents of which are incorporated herein by reference.

FIELD

Embodiments described herein relate generally to a semiconductor device and a method for manufacturing the same.

BACKGROUND

Some semiconductor memory devices, such as NAND-type electrically erasable programmable read-only memories (EEPROMs), may include a three-dimensional memory cell array in which memory cells are three-dimensionally arrayed. Such a memory cell array includes a stacked body in which conductive layers, which serve as word lines, and insulating layers are alternately stacked. To enable a contact plug to be connected to each conductive layer of the stacked body, a side of the stacked body is processed in a staircase pattern.

DETAILED DESCRIPTION

Figure 1:
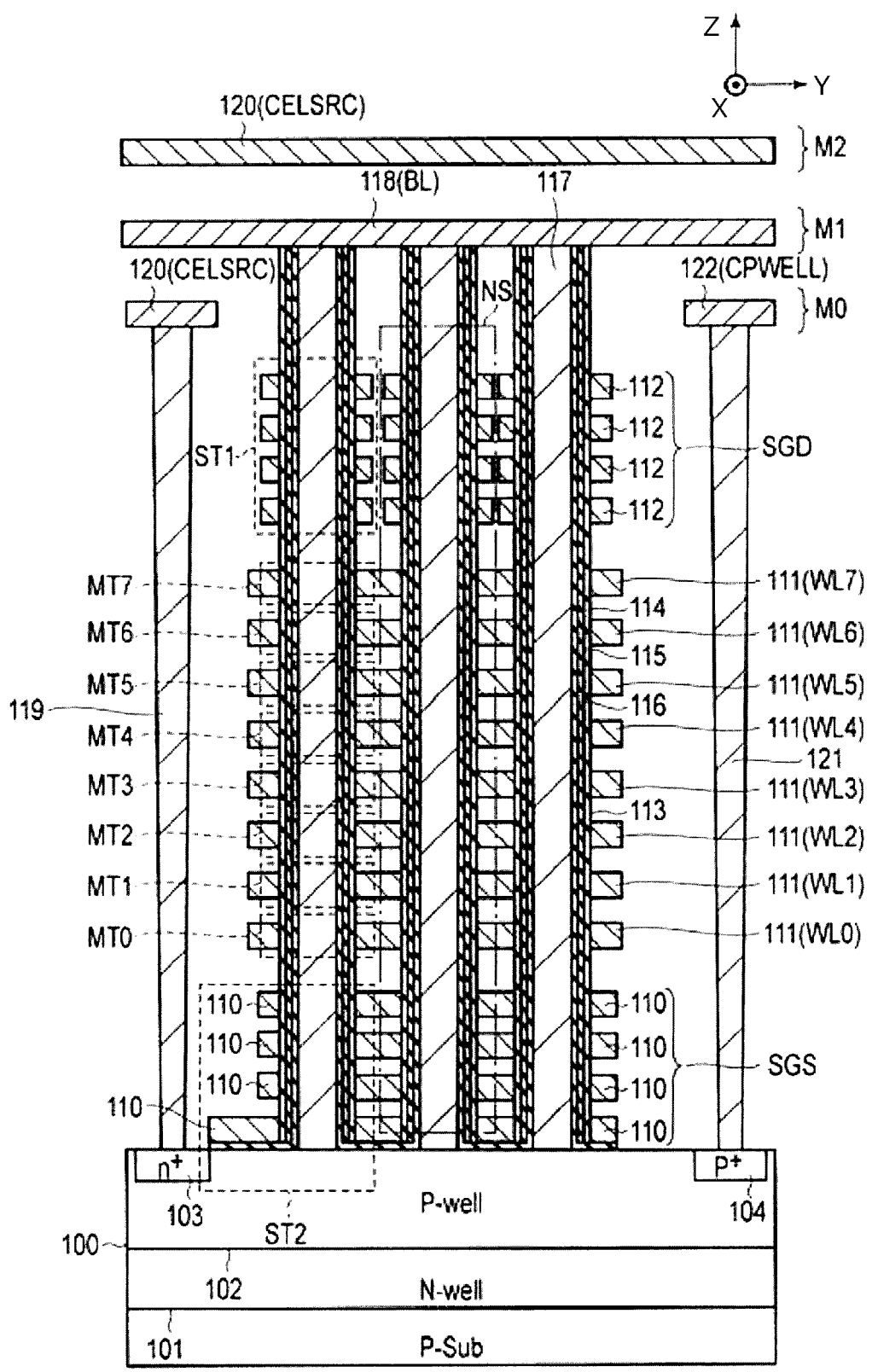
FIG. 1 is a diagram illustrating an example of a configuration of a memory cell array in a semiconductor device according to a first embodiment.

In a configuration as described above, when the side of the stacked body is processed in a staircase pattern, the thickness of an interlayer insulating film on a staircase portion differs between upper stairs and lower stairs depending on step differences of the staircase portion. Accordingly, when contact holes are formed in the interlayer insulating film, overetching is likely to occur at upper stairs of the stacked body and underetching is likely to occur at lower stairs of the stacked body. To address this issue, it is conceivable to, after forming a staircase portion of the stacked body, form an etching stopper film on the staircase portion and further form an interlayer insulating film on the etching stopper film. However, the etching stopper film is formed along the shape of the staircase portion of the stacked body, and is thus also formed on the side surfaces (riser portions) of the staircase portion. Accordingly, the etching stopper film protrudes to a contact region by the thickness thereof, so that the same contact region may have regions different in the thickness of the etching stopper film. This would result in difficulty in connecting a conductor and a contact to each other. Moreover, depositing the etching stopper film after formation of the staircase portion leads to a necessity of additionally performing a lithography process to remove an etching stopper film formed in a peripheral circuit region. Accordingly, the manufacturing process becomes longer and the manufacturing cost increases.

Non-limiting embodiments disclosed herein provide a semiconductor device which includes a stacked body configured with conductive layers and insulating layers and configured to enable contact plugs to be easily connected to the respective conductive layers while preventing the increase of the manufacturing process and manufacturing cost, and also provide a method for manufacturing the semiconductor device.

In general, according to at least one embodiment, a semiconductor device includes a stacked body including a plurality of conductive layers and a plurality of first insulating layers which are alternately stacked. The stacked body includes, on at least one side thereof, a staircase portion (a stair) having stairs (steps) formed from the conductive layers and the first insulating layers. A second insulating layer different in material from the first insulating layer is provided on an upper surface of the first insulating layer of the staircase portion. The second insulating layer is away from the conductive layer on the same first insulating layer. A third insulating layer is provided on the staircase portion. A plurality of contacts is provided in the first, second, and third insulating layers situated in the respective stairs of the staircase portion. The plurality of contacts leads from an upper surface of the third insulating layer to the conductive layer under the first insulating layer.

Hereinafter, embodiments of the present disclosure will be described with reference to the drawings. The present embodiments should not be construed to limit the present disclosure. In the following embodiments, vertical (up and down) directions of a semiconductor substrate represent relative directions taken when a surface thereof on which a semiconductor element is provided is faced up, and may be different from the vertical directions associated with gravitational acceleration. The drawings are schematic and conceptual ones, and, for example, the ratios of various illustrated portions are not necessarily the same as actual ratios. In the specification and the drawings, elements similar to those previously described with regard to the previously-described drawings are assigned the respective same reference characters, and the detailed description thereof is not repeated as appropriate.

First Embodiment

FIG. 1 is a diagram illustrating an example of a configuration of a memory cell array in a semiconductor device according to a first embodiment. Furthermore, in FIG. 1, for ease of visualization, insulating portions other than an insulating film formed in a memory hole 113 are omitted from illustration. Moreover, while, in the following embodiments, silicon is taken as an example of a semiconductor, a semiconductor other than silicon can also be used.

Furthermore, in the present specification, for the purpose of illustration, an XYZ orthogonal coordinate system is employed. In this orthogonal coordinate system, two directions which are parallel to the principal surface of a substrate 100 and are perpendicular to each other are assumed to be an X-direction and a Y-direction, and a direction which is perpendicular to both the X-direction and the Y-direction is assumed to be a Z-direction. A plurality of word lines (conductive layers) WL is stacked in layers along the Z-direction.

As illustrated in FIG. 1, in the semiconductor substrate 100, an n-type well region 101 is formed, and a p-type well region 102 is formed on the n-type well region 101. A plurality of NAND strings NS is formed on the p-type well region 102. Specifically, a plurality of wiring layers 110 serving as select gate lines SGS, a plurality of wiring layers 111 serving as word lines WL, and a plurality of wiring layers 112 serving as select gate lines SGD are formed on the p-type well region 102.

The wiring layers 110 are formed as, for example, four layers, are electrically connected to select gate lines SGS shared by a plurality of NAND strings NS, and serve as gate electrodes of two select transistors ST2.

The wiring layers 111 are formed as, for example, eight layers, and each wiring layer 111 is electrically connected to a shared word line WL.

The wiring layers 112 are formed as, for example, four layers and are connected to a corresponding select gate line SGD for each NAND string NS, and each wiring layer 112 serves as an electrode of one select transistor ST1.

The memory hole 113 is formed in such a manner as to penetrate through the wiring layers 110, 111, and 112 and lead to the p-type well region 102. A block insulating film 114, a charge storage film 115 (insulating film), and a gate insulating film 116 are sequentially formed on the side surface of the memory hole 113. A semiconductive film 117 is embedded in the memory hole 113. The semiconductive film 117 serves as a current pathway of the NAND string NS. A wiring layer 118 serving as a bit line BL is formed on the upper end of the semiconductive film 117.

As mentioned above, the select transistors ST2, a plurality of memory cell transistors MT, and the select transistor ST1 are sequentially stacked in layers on the p-type well region 102, and one memory hole 113 is associated with one NAND string NS.

An n$^+$-type impurity diffusion layer 103 and a p$^+$-type impurity diffusion layer 104 are formed in the surface of the p-type well region 102.

A contact plug 119 is formed on the n$^+$-type impurity diffusion layer 103, and a wiring layer 120 serving as a source line CELSRC is formed on the contact plug 119. The source line CELSRC is also formed in a layer M2, and the source line CELSRC in the layer M2 is electrically connected to a voltage generation circuit (not illustrated).

A contact plug 121 is formed on the p$^+$-type impurity diffusion layer 104, and a wiring layer 122 serving as a well wiring CPWELL is formed on the contact plug 121. The well wiring CPWELL is electrically connected to the voltage generation circuit (not illustrated).

A layer M0 in which the wiring layers 120 and 122 are formed is formed above the wiring layers 112 (select gate lines SGD) and below a layer M1 in which a wiring layer 118 is formed.

A plurality of above-described configurations is arranged in the depth direction of the drawing sheet in which FIG. 1 is drawn. FIG. 1 is configured with an aggregation of a plurality of NAND strings NS arranged in a row in the depth direction.

Moreover, the wiring layers 110 serve as common select gate lines SGS in the same block and are electrically connected to each other. The gate insulating film 116 is also formed between the wiring layer 110 in the lowermost layer and the p-type well region 102. The wiring layer 110 in the lowermost layer adjacent to the n$^+$-type impurity diffusion layer 103 and the gate insulating film 116 are formed extending to the vicinity of the n$^+$-type impurity diffusion layer 103.

With this configuration, when the select transistor ST2 is brought into an ON state, the formed channel electrically connects a memory cell transistor MT0 and the n$^+$-type impurity diffusion layer 103 to each other. The voltage generation circuit (not illustrated) is able to impart an electrical potential to the semiconductive film 117 by applying a voltage to the well wiring CPWELL.

Figure 2:
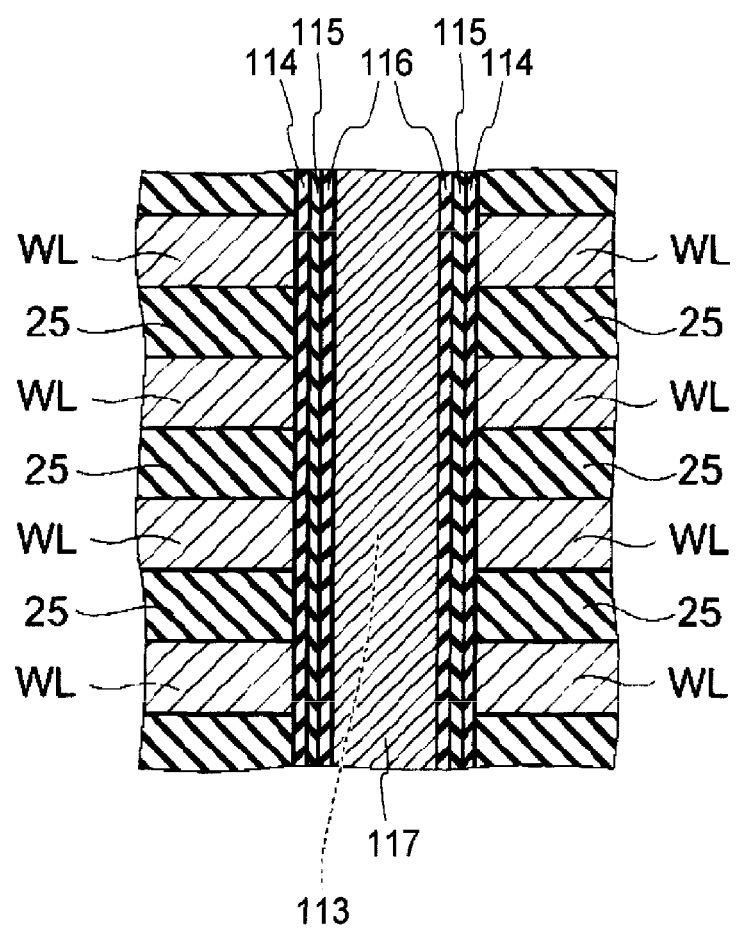
FIG. 2 is an enlarged sectional view of a portion in which a conductive film penetrates through a plurality of conductive layers (word lines) and insulating layers each situated between layers.

FIG. 2 is an enlarged sectional view of a portion in which the semiconductive film 117 penetrates through a plurality of conductive layers (word lines) WL and insulating layers 25 each situated between layers. In FIG. 2, insulating layers between the conductive layers WL, which are omitted from illustration in FIG. 1, are expressed as insulating layers 25.

Between the conductive layers WL and the semiconductive film 117, the block insulating film 114, the charge storage film 115, and the gate insulating film 116 are provided in order from the side of the conductive layers WL. The block insulating film 114 is in contact with the conductive layers WL, the gate insulating film 116 is in contact with the semiconductive film 117, and the charge storage film 115 is provided between the block insulating film 114 and the gate insulating film 116.

The semiconductive film 117 serves as a channel, the conductive layer WL serves as a control gate, and the charge storage film 115 serves as a data memory layer which stores electric charges injected from the semiconductive film 117. Thus, a memory cell having a configuration in which the control gate encompasses the channel is formed at an intersection portion between the semiconductive film 117 and each conductive layer WL.

The semiconductor device according to some embodiments is a non-volatile semiconductor memory device which allows data to be freely electrically erased and re-written and is capable of retaining memory content even when de-energized. For example, the memory cell is a memory cell with a charge trapping structure. The charge storage film 115 has a great number of traps for trapping electric charges (electrons) and is, for example, a silicon nitride film. The gate insulating film 116 is, for example, a silicon oxide film, and serves as a potential barrier when electric charges are injected from the semiconductive film 117 into the charge storage film 115 or when electric charges stored in the charge storage film 115 are diffused to the semiconductive film 117. The block insulating film 114 is, for example, a silicon oxide film, and prevents electric charges stored in the charge storage film 115 from diffusing into the conductive layers WL. The semiconductor device can be, for example, a NAND-type EEPROM.

Figure 3:
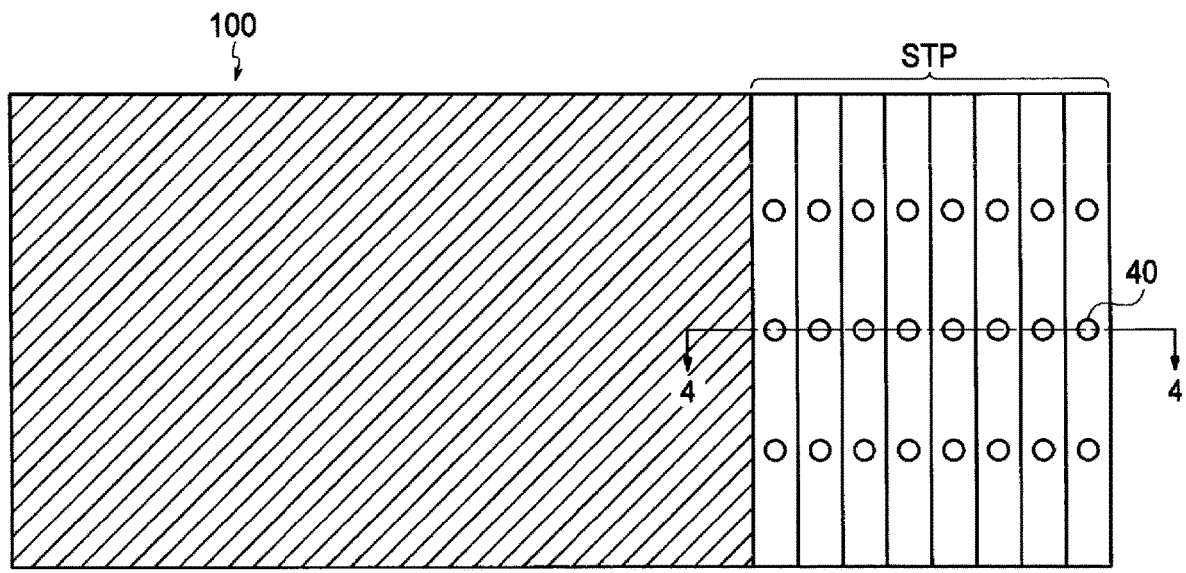
FIG. 3 is a schematic plan view illustrating an example of a configuration of a memory cell array.

FIG. 3 is a schematic plan view illustrating an example of a configuration of the memory cell array. As described with reference to FIG. 1 and FIG. 2, the memory cell array MCA includes a stacked body 100 configured with the conductive layers WL and the insulating layers 25, and includes a plurality of memory cells arrayed in a three-dimensional manner.

The memory cell array MCA is rectangular and includes a staircase portion STP at least at one side of its outer edges. The staircase portion STP is a connection region used to connect contact plugs 40 to the respective conductive layers WL of the stacked body. In the staircase portion STP, sets of the conductive layer WL and the insulating layer 25 are formed in a staircase pattern, i.e., as steps forming a stair.

Figure 4:
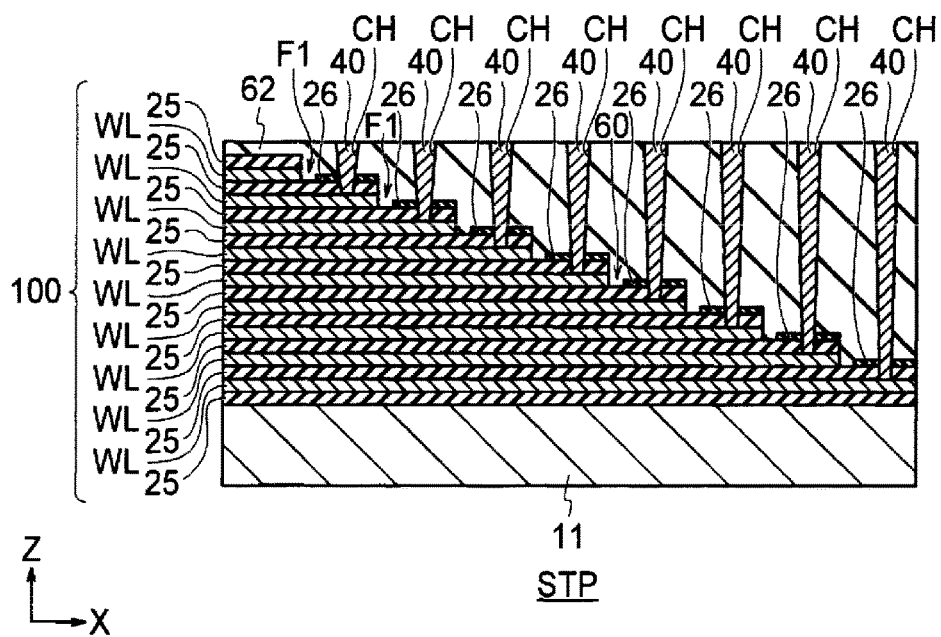
FIG. 4 is a sectional view of a staircase portion taken along line 4-4 in FIG. 3.

FIG. 4 is a sectional view of the staircase portion STP taken along line 4-4 in FIG. 3. The stacked body 100 includes a plurality of conductive layers WL and a plurality of insulating layers (first insulating layers) 25 alternately stacked on an under layer 11. At least one side of the stacked body 100 serves as a connection region of the contact plugs 40 and is processed in a staircase pattern. The staircase portion STP has stairs each of which is configured with a set of the conductive layer WL and the insulating layer 25.

A stopper film (second insulating layer) 26 is provided on the upper surface (tread surface) of the insulating layer 25 of each stair. The stopper film 26 has a material different in etching speed from that of the insulating layer 25. For example, the insulating layer 25 is a silicon oxide film, and the stopper film 26 is a silicon nitride film. Moreover, the stopper film 26 is away from the conductive layer WL adjacent in a direction (X-direction) perpendicular to the stacking direction on the same insulating layer 25. More specifically, a gap 60 is present between the stopper film 26 and the conductive layer WL provided on the same insulating layer 25, so that the stopper film 26 and the conductive layer WL are away from each other via the gap 60.

An interlayer insulating film (third insulating layer) 62 is provided on the stacked body 100 and the staircase portion STP. The interlayer insulating film 62 lies between the stopper film 26 and the conductive layer WL provided on the same insulating layer 25. In other words, the interlayer insulating film 62 is embedded in the gap 60. The interlayer insulating film 62 has a material different in etching speed from that of the stopper film 26, and, is, for example, a silicon oxide film. Furthermore, the interlayer insulating film 62 and the insulating layer 25 can be made from the same material.

Since the upper surface of the interlayer insulating film 62 is planarized, the film thickness of the interlayer insulating film 62 is smaller on the upper stair portion of the staircase portion STP and larger on the lower stair portion thereof. Accordingly, the depths (lengths) of the contact plugs 40 differ between the upper stair portion and the lower stair portion of the staircase portion STP.

Each contact plug 40 is provided in such a way as to penetrate through the insulating layer 25, the stopper film 26, and the interlayer insulating film 62 on each stair of the staircase portion STP, and leads from the upper surface of the interlayer insulating film 62 to the conductive layer WL under the insulating layer 25. Accordingly, a contact plug 40 provided in the upper stair portion of the staircase portion STP is relatively shallow (short) and a contact plug 40 provided in the lower stair portion of the staircase portion STP is relatively deep (long). The contact plugs 40 are electrically connected to wirings of word lines (not illustrated) provided on the interlayer insulating film 62.

The stopper film 26 is provided on a tread surface F1 of each stair of the staircase portion STP, and serves as an etching stopper film when being used to form a contact hole CH. The contact hole CH is once formed in such a way as to extend from the upper surface of the interlayer insulating film 62 to the stopper film 26 of each stair. The stopper film 26 is, for example, a silicon nitride film and the interlayer insulating film 62 is, for example, a silicon oxide film. Accordingly, the interlayer insulating film 62, when subjected to etching with, for example, $C_4F_6/Ar/O_2$-based gas, has high etching selectivity with respect to the stopper film 26. With this, the contact hole CH once stops at the stopper film 26 irrespective of the thickness of the interlayer insulating film 62. After that, etching is performed on the stopper film 26 and the insulating layer 25 at the bottom portion of the contact hole CH. The total film thickness of the stopper film 26 and the insulating layer 25 is almost even between the stairs of the staircase portion STP. Accordingly, contact holes CH with different depths can be formed without excess etching (overetching) or shortage of etching (underetching) being caused. Furthermore, overetching may cause a phenomenon in which the contact hole penetrates through the conductive layer WL. Underetching may cause a phenomenon in which the contact hole does not lead to the conductive layer WL, and a failure of contact therefore occurs.

Hereinafter, a method for manufacturing a semiconductor device according to some embodiments is described in detail.

FIG. 5A to FIG. 9 are sectional views illustrating an example of a method for manufacturing the semiconductor device according to the first embodiment.

Figure 5A:
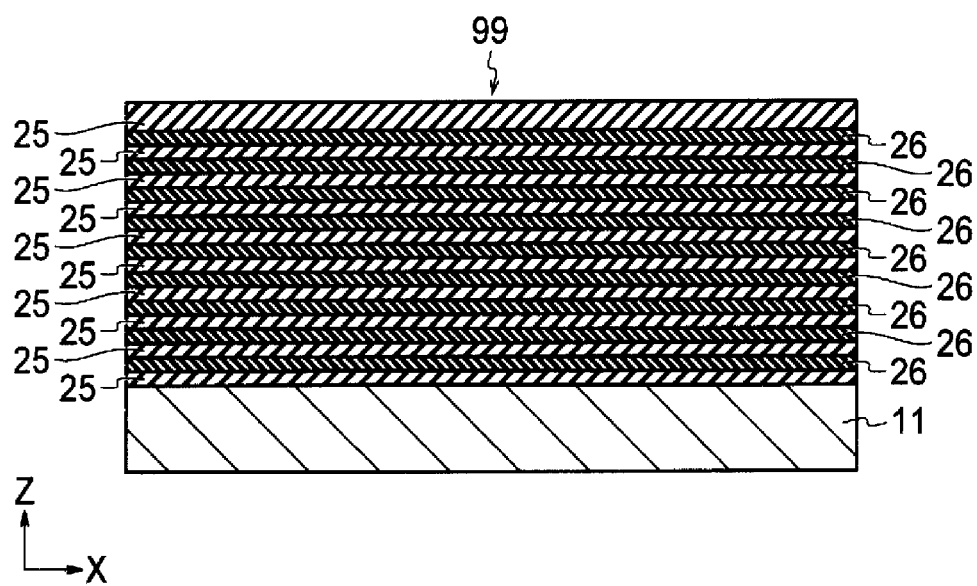
FIGS. 5A and 5B are sectional views illustrating an example of a method for manufacturing the semiconductor device according to the first embodiment.

First, as illustrated in FIG. 5A, the method includes alternately stacking a plurality of insulating layers (first insulating layers) 25 and a plurality of insulating layers (second insulating layers) 26 on an under layer 11, thus forming a stacked body 99. The under layer 11 includes, for example, the substrate 100 illustrated in FIG. 1 or a P-type well. The first insulating layer 25 and the second insulating layer 26 are formed from respective materials different in etching speed. For example, the first insulating layer 25 is a silicon oxide film and the second insulating layer 26 is a silicon nitride film. The film thickness of each of the first insulating layer 25 and the second insulating layer 26 is, for example, about 30 nanometers (nm). The first insulating layer 25 and the second insulating layer 26 can be formed by, for example, a chemical vapor deposition (CVD) method. The number of layers about the first insulating layer 25 and the second insulating layer 26 is not specifically limited but can be any number. Furthermore, the film thickness of the first insulating layer 25 in the uppermost layer is larger than that of each of the first insulating layers 25 in the other layers, and is set approximately equal to the sum of film thicknesses of each of the first insulating layers 25 in the other layers and the second insulating layer 26.

Figure 5B:
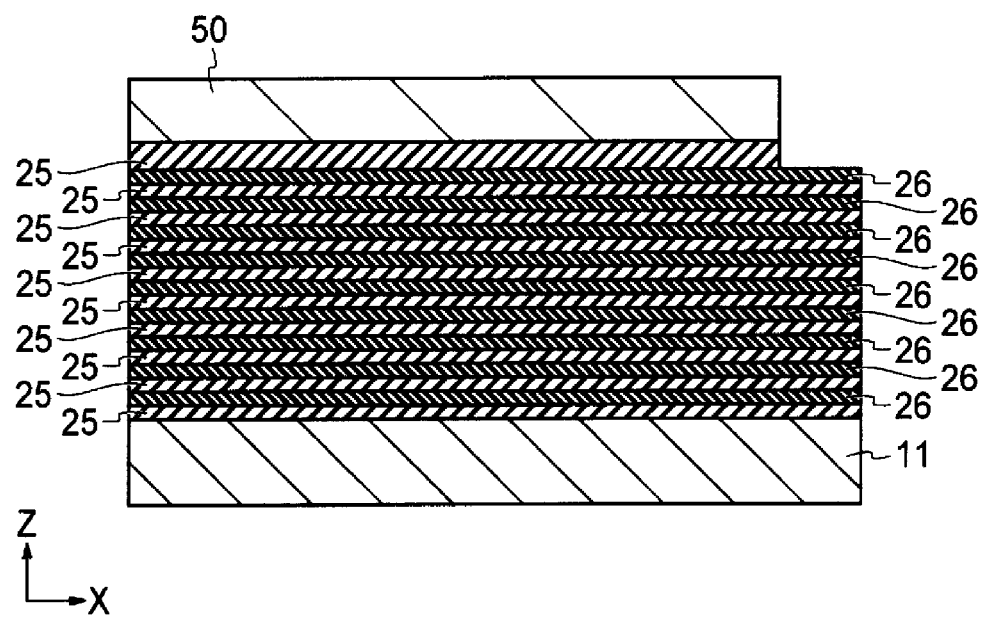

Next, as illustrated in FIG. 5B, the method forms a resist film 50 on the stacked body 99 using a lithography technique. At this time, the resist film 50 is subjected to patterning in such a way as to have a planar layout of the lowermost stair illustrated in FIG. 4.

Next, the method removes the first insulating layer 25 in the uppermost stair using a reactive ion etching (RIE) method with the resist film 50 used as a mask. At this time, the second insulating layer 26 situated under the first insulating layer 25 in the uppermost stair is caused to remain. With this, as illustrated in FIG. 5B, the second insulating layer 26 in the uppermost stair becomes exposed.

Next, the method performs slimming (thinning) on the resist film 50 in the horizontal direction (a direction perpendicular to the stacking direction Z) using, for example, an isotropic plasma etching method. With this, as illustrated in FIG. 6A, the side surface of the resist film 50 recedes in the horizontal direction and the resist film 50 is made to have a planar layout of the second lowermost stair.

Next, the method performs etching on the first and second insulating layers 25 and 26 using the RIE method with the slimmed resist film 50 and the first insulating layer 25 in the uppermost stair used as a mask. At this time, with the first insulating layer 25 in the uppermost stair used as a mask, the method performs etching on the first and second insulating layers 25 and 26 in a stair under the uppermost stair (in the second stair), and processes the first insulating layer 25 in the uppermost stair with a pattern of the slimmed resist film 50. At this time, the film thickness of the first insulating layer 25 in the uppermost stair is almost equal to the sum of film thicknesses of each of the first insulating layers 25 in the other layers and the second insulating layer 26. With this, when the first insulating layer 25 in the uppermost stair is subjected to etching with the resist film 50 used as a mask, the first and second insulating layers 25 and 26 in the second stair are also subjected to etching with the first insulating layer 25 in the uppermost stair used as a mask. With this, as illustrated in FIG. 6B, the staircase portion STP is processed in such a manner that the second insulating layer 26 appears on the tread surface of each stair.

Figure 6A:
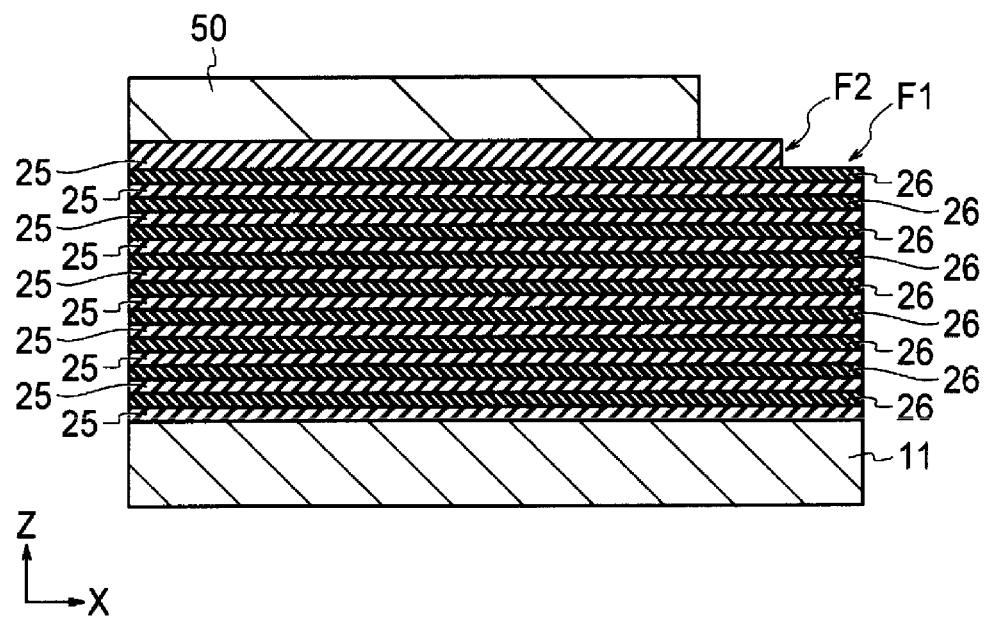
FIGS. 6A and 6B are sectional views illustrating the example of the method for manufacturing the semiconductor device, which is continued from FIGS. 5A and 5B.
Figure 6B:
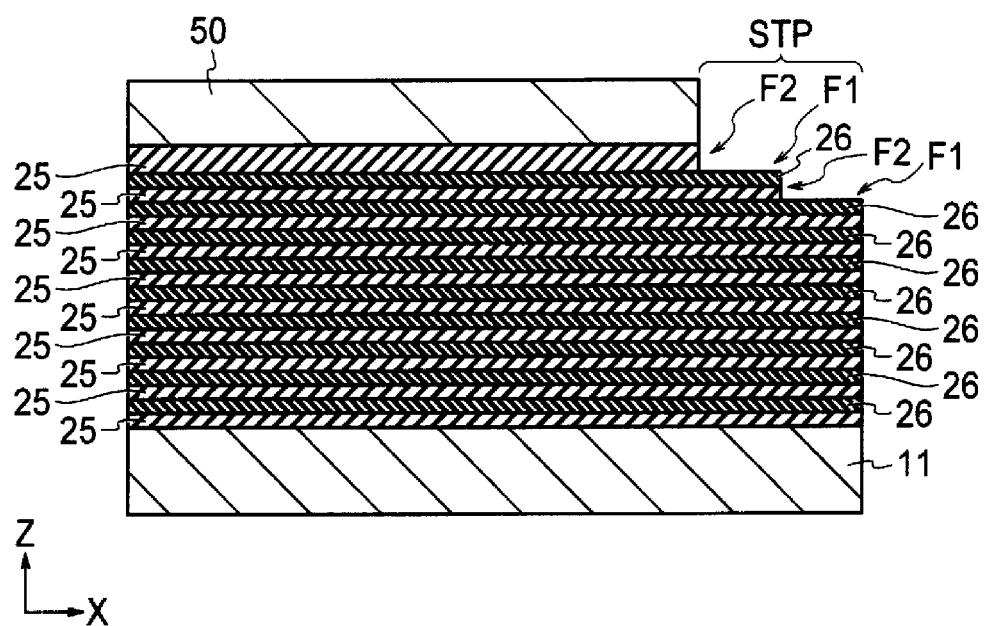
Figure 7A:
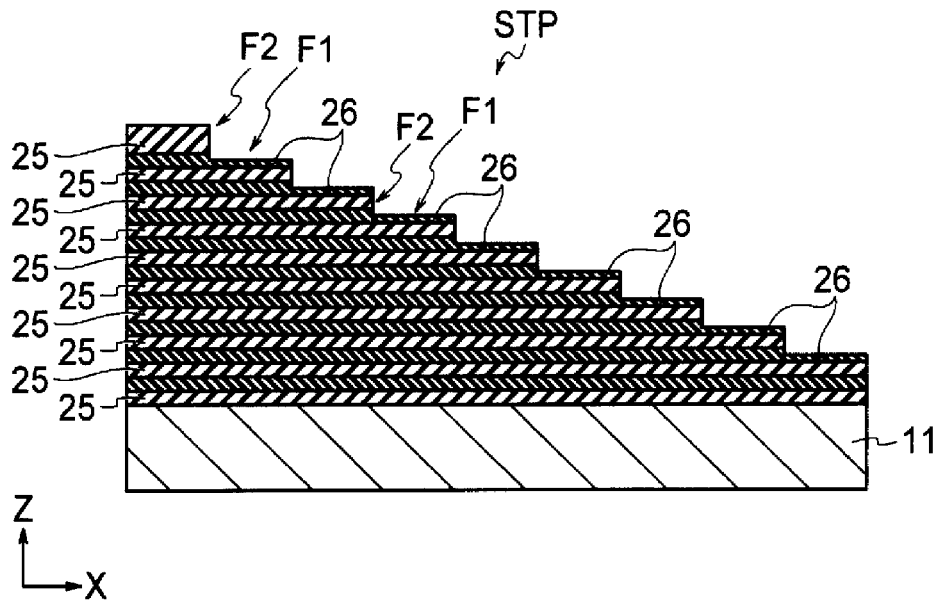
FIGS. 7A and 7B are sectional views illustrating the example of the method for manufacturing the semiconductor device, which is continued from FIGS. 6A and 6B.

The method repeats slimming of the resist film 50 illustrated in FIG. 6A and etching of the first and second insulating films 25 and 26 illustrated in FIG. 6B to process at least one side of the stacked body 99 in a staircase pattern, thus forming the staircase portion STP as illustrated in FIG. 7A. With this, the second insulating layer 26 is provided on the upper surface (tread surface) F1 of each stair of the staircase portion STP. In other words, the upper surface of the first insulating layer 25 in the tread surface F1 becomes covered with the second insulating layer 26. In view of the side surface of the riser portion F2 of each stair of the staircase portion STP, the second insulating layer 26 is provided on the first insulating layer 25. Furthermore, the film thickness of the second insulating layer 26 remaining as the tread surface F1 of each stair is assumed to be such a degree as to function as an etching stopper film used to form a contact hole CH (for example, about 20 nm to 30 nm).

Figure 7B:
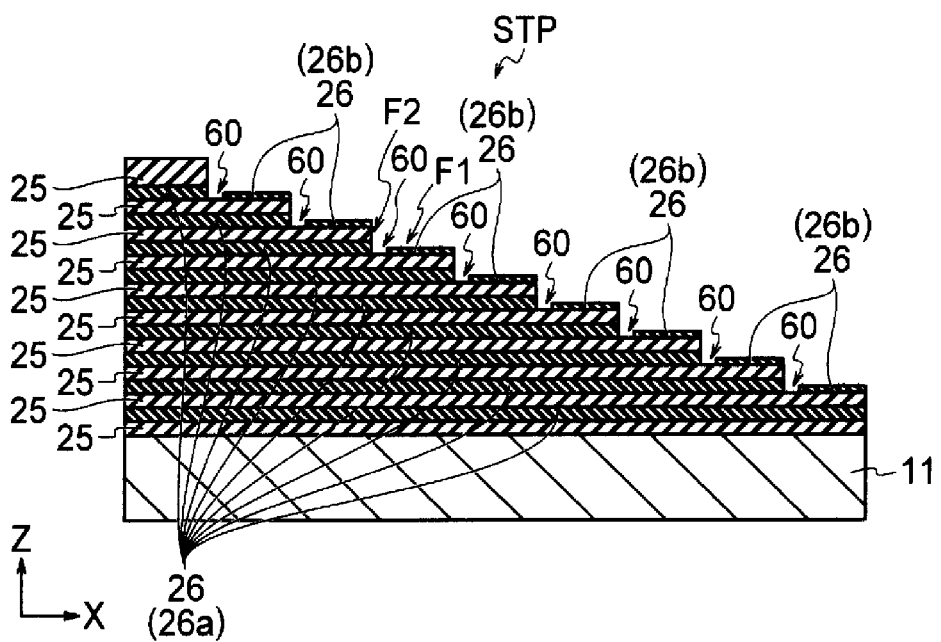

Next, the method performs dry etching on the second insulating layers 26 of the staircase portion STP. At this time, the method sets radio frequency (RF) power to a somewhat high value (for example, 5 kilowatts (kW)) and performs etching in such a manner that the deposition property of a flat portion becomes high with use of $CH_2F_2$/Ar-based gas. With this, in flat and wide regions, the etching residue of the second insulating layer 26 remains as a deposition substance, and, in corner portions or narrow regions, the second insulating layer 26 is removed due to the ion sputtering effect. Accordingly, as illustrated in FIG. 7B, the second insulating layer 26 situated in a corner portion between the riser portion F2 of the staircase portion STP and the tread surface portion F1 of a stair just below the above-mentioned riser portion F2 is selectively and partially removed. With this, a gap 60 is formed in a corner portion between the riser portion F2 of the staircase portion STP and the tread surface portion F1 of the next lower stair. Hereinafter, for the sake of convenience, a second insulating layer 26 sandwiched between first insulating layers 25 adjacent in the stacking direction Z is referred to as a "second insulating layer 26a", and a second insulating layer 26 situated on a tread surface of the staircase portion STP is referred to as a "second insulating layer 26b". The gap 60 is provided for separation between the second insulating layer 26a, which is situated between first insulating layers 25 adjacent in the stacking direction Z, and the second insulating layer 26b, which is situated on a tread surface of the staircase portion STP. With this, in the gap 60, the first insulating layer 25 is exposed. In this way, in some embodiments, the second insulating layer 26b, which is separated from the second insulating layer 26a situated between the first insulating layers 25, remains on the tread surface of the staircase portion STP. Furthermore, in a later stage, the second insulating layer 26a functions as a sacrificial film which is to be substituted with a conductive layer WL. The second insulating layer 26b functions as a stopper film used to form a contact hole CH in a later stage. The second insulating layer 26b is the same as the stopper film 26 illustrated in FIG. 4.

Figure 8A:
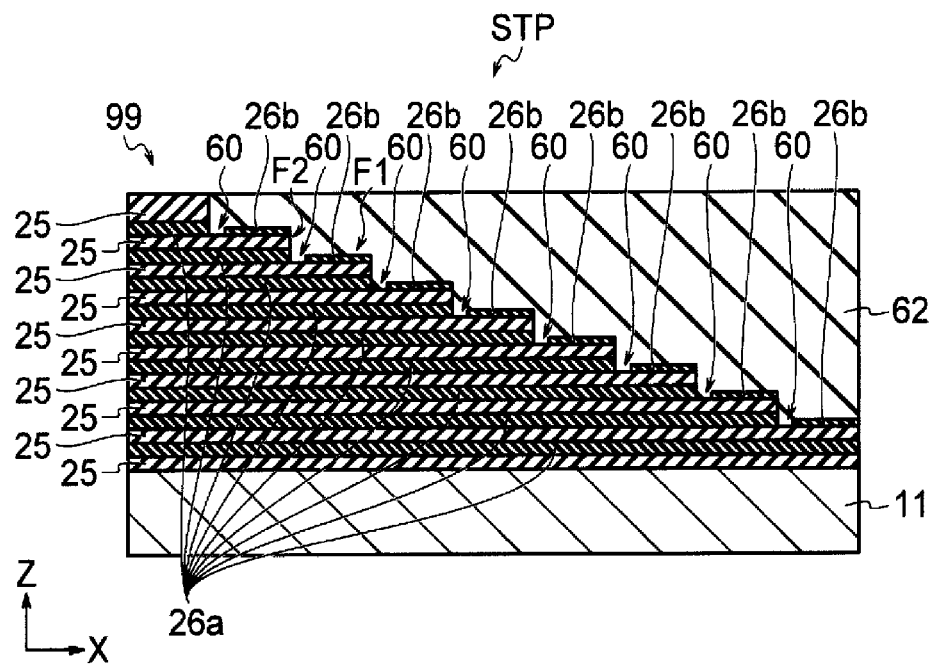
FIGS. 8A and 8B are sectional views illustrating the example of the method for manufacturing the semiconductor device, which is continued from FIGS. 7A and 7B.

Next, as illustrated in FIG. 8A, the method deposits an interlayer insulating film (third insulating layer) 62 on the stacked body 99, and planarizes the upper surface of the interlayer insulating film 62 using a chemical mechanical polishing (CMP) method. With this, the interlayer insulating film 62 is formed on the staircase portion STP and the interlayer insulating film 62 is embedded in the gap 60. The interlayer insulating film 62 is made from a material high in etching selectivity with respect to the second insulating layer 26, for example, a silicon oxide film such as d-TEOS. Since the interlayer insulating film 62 is planarized, the film thickness of the interlayer insulating film 62 provided on the lower stair side of the staircase portion STP is larger than the film thickness of the interlayer insulating film 62 provided on the upper stair side of the staircase portion STP.

Next, the method includes forming slits (not illustrated) in the stacking direction of the stacking body 99, and removing, via the slits, the second insulating layers 26a each situated between the insulating layers 25 using, for example, an isotropic wet etching method. At this time, the second insulating layer 26b situated on the tread surface F1 of the staircase portion STP is away from the second insulating layer 26a via the gap 60 and is separated by the interlayer insulating film 62 provided in the gap 60. Accordingly, an etchant or etching gas for the second insulating layer 26a does not reach the second insulating layer 26b, and, therefore, while the second insulating layer 26b remains unremoved, the second insulating layer 26a is removed.

Figure 8B:
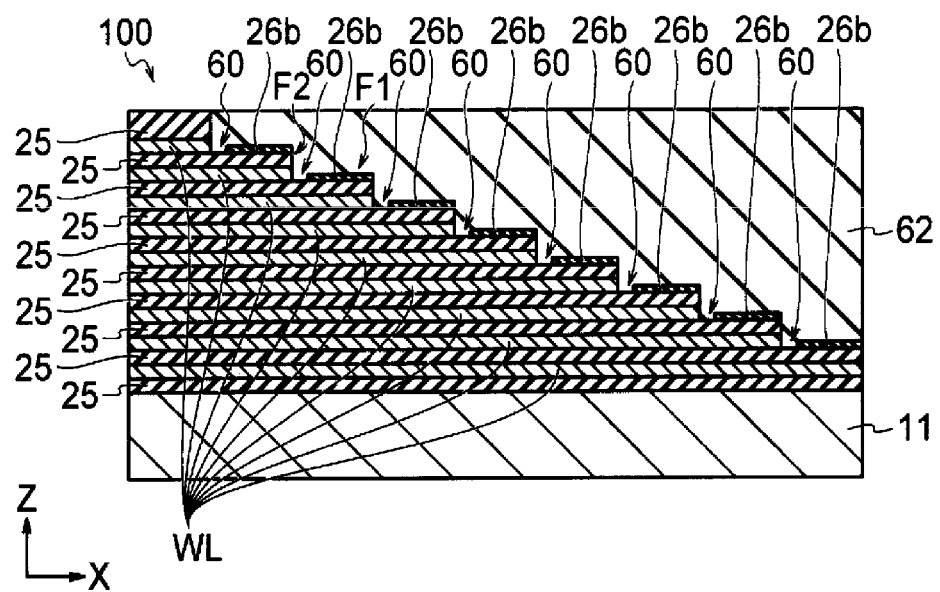

Next, after the second insulating layer 26a is removed, the method fills a space between the first insulating layers 25 with the material of the conductive layer WL. Thus, the second insulating layer 26a is substituted with the conductive layer WL. The material of the conductive layer WL to be used includes, for example, a conductive material, such as tungsten or doped silicon. With this, as illustrated in FIG. 8B, a stacked body 100 configured with a plurality of conductive layers WL and a plurality of first insulating layers 25 alternately stacked is formed.

Next, the method includes forming contact holes CH using the lithography technique and the RIE method. The tread surface of each stair of the staircase portion STP is used as a contact region. Accordingly, the contact hole CH is formed above the tread surface F1 of each stair of the staircase portion STP. At this time, the second insulating layer 26b functions as an etching stopper film for the contact hole CH. Accordingly, while the film thicknesses of the interlayer insulating film 62 on the respective stairs differ, etching is once stopped at the surface of the second insulating layer 26b in each stair of the staircase portion STP.

Figure 9:
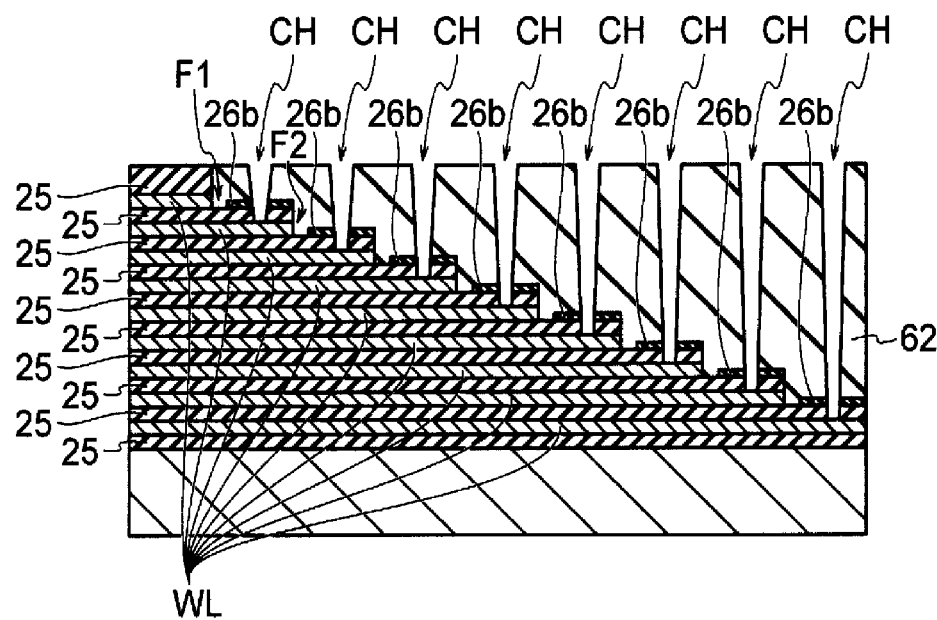
FIG. 9 is a sectional view illustrating the example of the method for manufacturing the semiconductor device, which is continued from FIGS. 8A and 8B.

Further, the method includes forming etching on the second insulating layer (stopper film) 26b and the insulating layer 25 at the bottom portion of the contact hole CH. Since the total film thickness of the second insulating layer 26b and the insulating layer 25 is almost even in each stair of the staircase portion STP, the contact holes CH can be formed as illustrated in FIG. 9 without excess etching (overetching) or shortage of etching (underetching) being caused.

Next, the method includes embedding the material of the contact plug 40 in the contact hole CH. The material of the contact plug 40 to be used includes, for example, tungsten. With this, as illustrated in FIG. 4, the contact plug 40 is formed in such a way as to penetrate through the interlayer insulating film 62, the second insulating layer 26b, and the first insulating layer 25 on the tread surface F1 of the staircase portion STP and lead from the upper surface of the interlayer insulating film 62 to the conductive layer WL under the first insulating layer 25.

After that, the method forms, for example, wirings for word lines (not illustrated) on the contact holes CH, thus completing a semiconductor device according to some embodiments.

As described above, according to some embodiments, the stopper film 26 (second insulating layer 26b) is formed in the same process as that for the sacrificial film (second insulating layer 26a), which is to be substituted with the conductive layer WL, and remains on the tread surface F1 of the staircase portion STP. Accordingly, the stopper film 26 is not required to be formed differently from the sacrifice film (second insulating layer 26a).

If a stopper film is formed after formation of the stacked body 99 or 100, the stopper film is formed along the shape of the staircase portion and is thus also formed on the side surface (riser portion) of the staircase portion. Accordingly, the stopper film protrudes to a contact region (tread surface portion) by the thickness thereof, so that the same contact region may have regions different in the thickness of the stopper film. If the contact region is made narrower by microfabrication, the thickness of the stopper film at the contact portion would become unlikely to be made even.

On the other hand, according to some embodiments, the stopper film 26 is formed in the same process as that for the sacrifice film (second insulating layer 26a), which is to be substituted with the conductive layer WL. Accordingly, even if the contact region is made narrower by microfabrication, the thickness of the stopper film 26 at the tread surface portion of the staircase portion STP is approximately even, so as to be substantially uniform. This enables facilitating and ensuring a connection between the contact plug 40 and the conductive layer WL and improving the reliability of the semiconductor device.

Moreover, when the second insulating layer 26a serving as a sacrificial film is substituted with the conductive layer WL, the stopper film 26 (second insulating layer 26b) is away from the second insulating layer 26a and the interlayer insulating film 62 is embedded in a gap between the second insulating layer 26b and the second insulating layer 26a. The interlayer insulating film 62 is a material high in etching selectivity with respect to the second insulating layers 26a and 26b, as with the first insulating layer 25. For example, in a case where each of the second insulating layers 26a and 26b is a silicon nitride film, each of the interlayer insulating film (third insulating layer) 62 and the first insulating layer 25 is a silicon oxide film. With this, when the second insulating layer 26a is substituted with the conductive layer WL, the stopper film 26 (second insulating layer 26b) can remain on the tread surface of the staircase portion STP without being removed.

Moreover, the gap 60 between the second insulating layer 26a and the second insulating layer 26b is formed in a self-aligned manner without use of a lithography technique but with use of dry etching high in deposition properties. Accordingly, an additional lithography process is not required with respect to an existing semiconductor manufacturing process. As a result, the method for manufacturing a semiconductor device according to some embodiments is able to easily form contact plugs 40 high in reliability while preventing or reducing an increase in manufacturing process and cost.

(Modification)

FIG. 10A to FIG. 11B are sectional views illustrating a method for manufacturing a semiconductor device according to a modification of the first embodiment.

In the first embodiment, during the stage of forming the staircase portion STP, as illustrated in FIG. 5B and FIG. 6B, the second insulating layer 26 is exposed on the tread surface F1 of each stair of the staircase portion STP.

On the other hand, in the present modification, during the process of forming the staircase portion STP, the first insulating layer 25 is exposed on the tread surface F1 of each stair of the staircase portion STP. After that, when forming the final stair of the staircase portion STP, the method causes the second insulating layer 26 to remain.

Figure 10A:
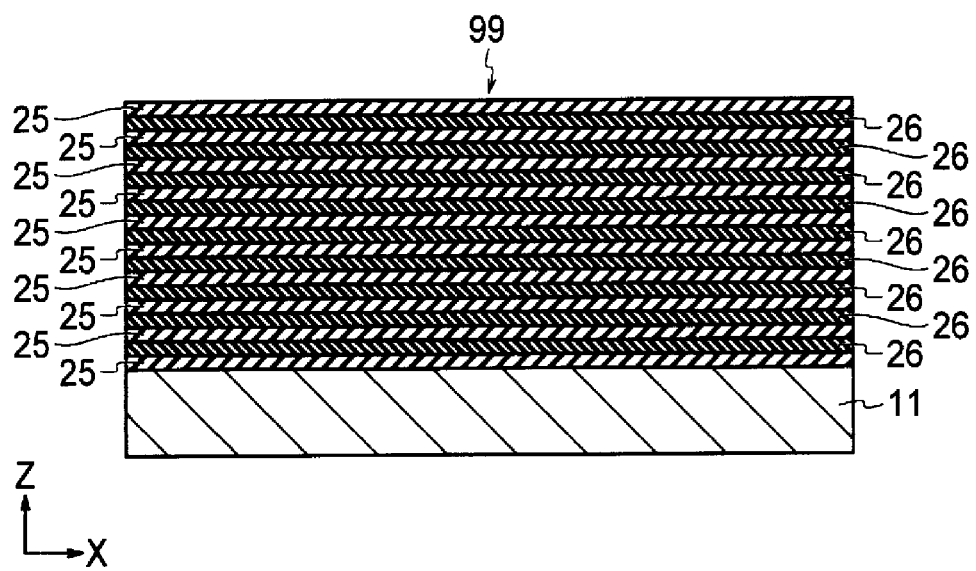
FIGS. 10A and 10B are sectional views illustrating a method for manufacturing a semiconductor device according to a modification of the first embodiment.
Figure 10B:
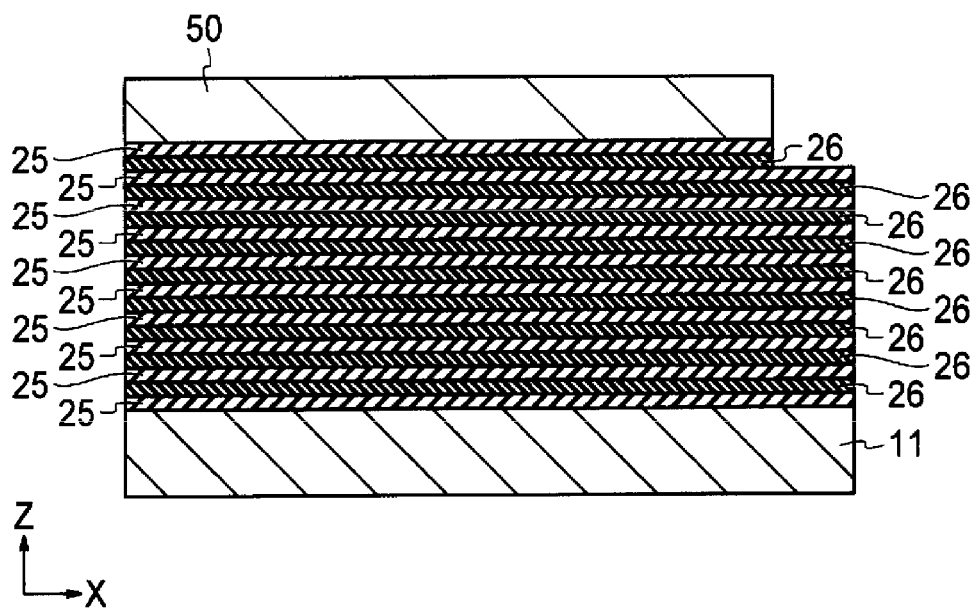

For example, after forming a stacked body 99 as illustrated in FIG. 10A, the method forms a resist film 50 on the stacked body 99 as illustrated in FIG. 10B with the use of the lithography technique. At this time, the resist film 50 is subjected to patterning in such a way as to have a planar layout of the lowermost stair illustrated in FIG. 4.

Next, the method removes the first and second insulating layers 25 and 26 together using the RIE method with the resist film 50 used as a mask. With this, as illustrated in FIG. 10B, the first insulating layer 25 of the second stair is exposed.

Figure 11A:
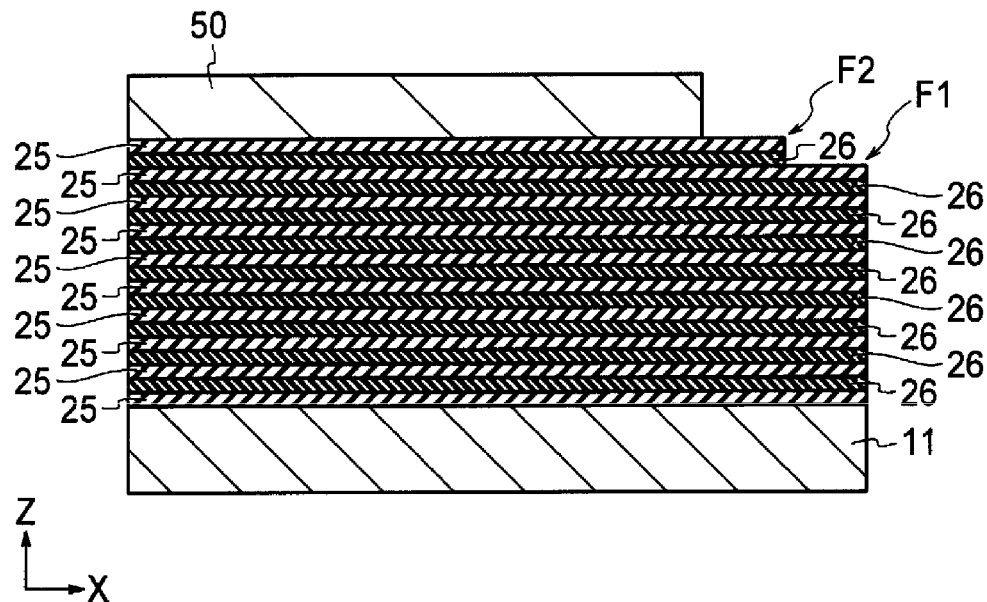
FIGS. 11A and 11B are sectional views illustrating the method for manufacturing the semiconductor device, which is continued from FIGS. 10A and 10B.

Next, after performing slimming on the resist film 50 as illustrated in FIG. 11A, the method performs, with the resist film 50 and the second insulating layer 26 of the uppermost stair used as a mask, etching on the first and second insulating layers 25 and 26 situated under those together. With this, as illustrated in FIG. 11B, a staircase portion STP is formed.

Figure 11B:
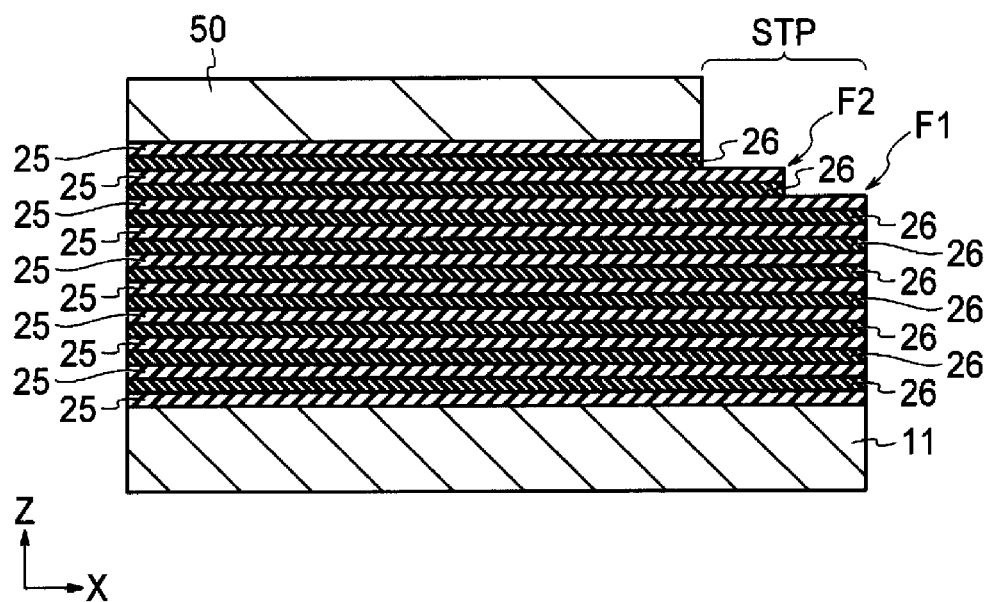

The method repeats slimming of the resist film 50 illustrated in FIG. 11A and etching of the first and second insulating films 25 and 26 illustrated in FIG. 11B to process at least one side of the stacked body 99 in a staircase pattern, thus forming the staircase portion STP. However, when forming the final stair of the staircase portion STP, the method causes the second insulating layer 26 to remain while removing the first insulating layer 25. With this, the second insulating layer 26 remains on the upper surface (tread surface) of each stair of the staircase portion STP as illustrated in FIG. 7A. In this way, a configuration can be employed in which, when the final stair of the staircase portion STP is formed, the second insulating layer 26 appears on the tread surface F1 of each stair of the staircase portion STP.

After that, the method performs the processes described with reference to FIG. 7A to FIG. 9, thus obtaining a device similar to the semiconductor device according to the first embodiment. Accordingly, the present modification is able to attain an advantageous effect similar to that of the first embodiment.

Second Embodiment

Figure 12:
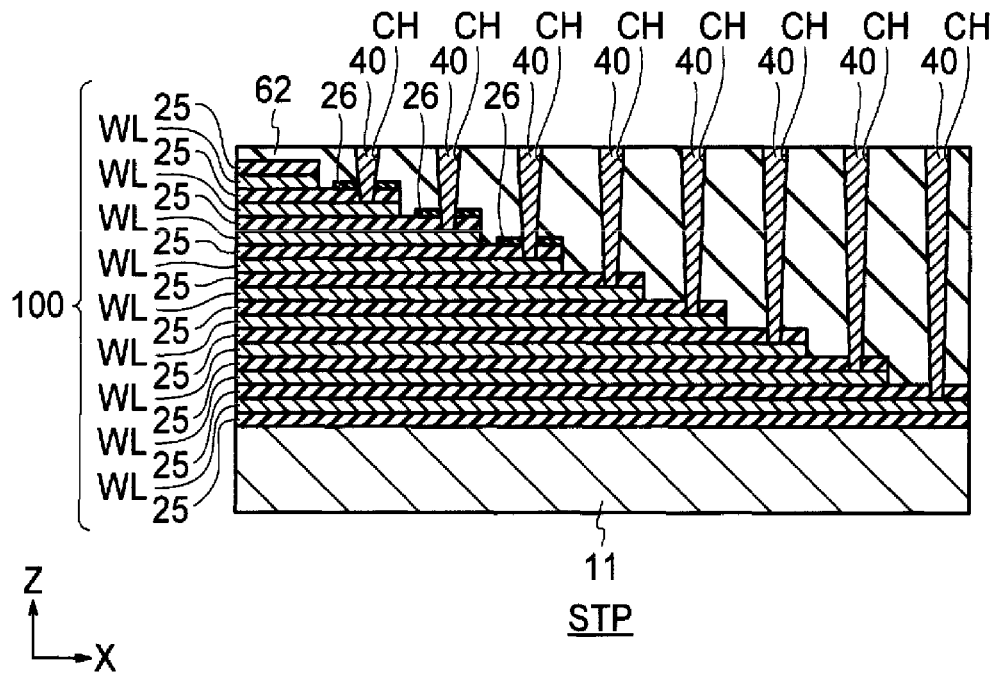
FIG. 12 is a sectional view illustrating a configuration example of a semiconductor device according to a second embodiment.

FIG. 12 is a sectional view illustrating a configuration example of a semiconductor device according to a second embodiment. In the second embodiment, the stopper films 26 are provided at an upper stair portion of the staircase portion STP but are not provided at a lower stair portion of the staircase portion STP. In the upper stair portion of the staircase portion STP, since the film thickness of the interlayer insulating film 62 is relatively small, providing the stopper films 26 enables preventing or reducing overetching at the time of formation of the contact holes CH. On the other hand, in the lower stair portion of the staircase portion STP, since the film thickness of the interlayer insulating film 62 is relatively large and overetching is unlikely to occur, the stopper films 26 are not provided in the lower stair portion of the staircase portion STP.

To form the staircase portion STP according to the second embodiment, at the time of formation of the stacked body 99, the film thickness of the second insulating layer (stopper film) 26 in the upper stair portion only needs to be made larger than that in the lower stair portion. This is because, when the second insulating layers 26 in the lower stair portion are removed, the second insulating layers 26 in the upper stair portion remain.

Alternatively, after the stopper films 26 are formed in the respective stairs of the staircase portion STP as in the first embodiment or the modification, the stopper films 26 in the lower stair portion can be removed with use of the lithography technique and the etching technique.

Furthermore, in the second embodiment, the stopper films 26 are provided in three stairs of the upper stair portion and are not provided in the other stairs, i.e., stairs of the lower stair portion. However, the stopper films 26 can be provided in any number of stairs of the upper stair portion.

The other configurations of the second embodiment can be similar to the corresponding configurations of the first embodiment. Accordingly, the second embodiment is able to attain an advantageous effect similar to that of the first embodiment.

Third Embodiment

Figure 13:
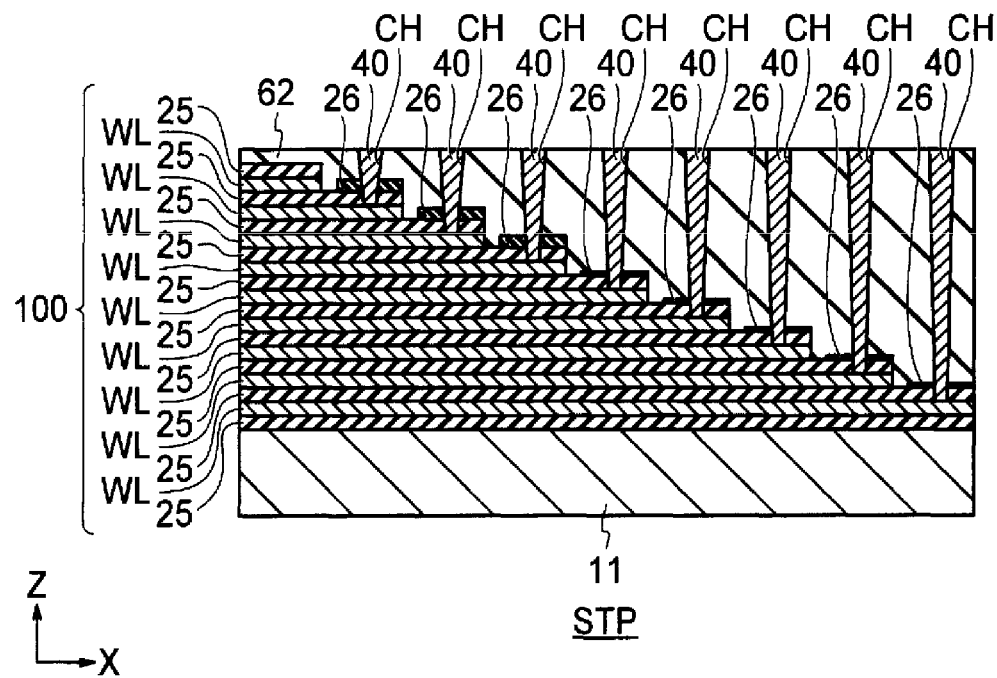
FIG. 13 is a sectional view illustrating a configuration example of a semiconductor device according to a third embodiment.

FIG. 13 is a sectional view illustrating a configuration example of a semiconductor device according to a third embodiment. In the third embodiment, the stopper films 26 in an upper stair portion of the staircase portion STP are formed relatively thick. The film thicknesses of the stopper films 26 in a lower stair portion are smaller than those of the stopper films 26 in the upper stair portion. In this case, since the film thickness of the interlayer insulating film 62 is relatively small in the upper stair portion of the staircase portion STP, thickening the stopper films 26 enables preventing or reducing overetching at the time of formation of the contact holes CH. On the other hand, in the lower stair portion of the staircase portion STP, since the film thickness of the interlayer insulating film 62 is relatively large and overetching is unlikely to occur, the film thicknesses of the stopper films 26 in the lower stair portion of the staircase portion STP are made small.

To form the staircase portion STP according to the third embodiment, at the time of formation of the stacked body 99, the film thickness of the second insulating layer (stopper film) 26 in the upper stair portion only needs to be made larger than that in the lower stair portion. With this, at the time of formation of the staircase portion STP, the second insulating layer 26 in the lower stair portion remains relatively small in thickness and, at the same time, the second insulating layer 26 in the upper stair portion remains relatively large in thickness.

Alternatively, after the stopper films 26 are formed in the respective stairs of the staircase portion STP as in the first embodiment or the modification, with use of the lithography technique and the etching technique, the film thicknesses of the stopper films 26 in the lower stair portion can be made small by etching.

The other configurations of the third embodiment may be similar to the corresponding configurations of the first embodiment. Accordingly, the third embodiment is able to attain an advantageous effect similar to that of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a stacked body including a plurality of conductive layers and a plurality of first insulating layers alternately stacked, and including, on at least one side thereof, a staircase portion having stairs formed by the conductive layers and the first insulating layers;
a second insulating layer provided on an upper surface of the first insulating layer of the staircase portion, being disposed away from the conductive layer on the same first insulating layer, and differing in material from the first insulating layer;
a third insulating layer provided on the staircase portion; and
a plurality of contacts provided in the first, second, and third insulating layers situated in respective stairs of the staircase portion, and leading from an upper surface of the third insulating layer to the conductive layer under the first insulating layer,
wherein, on the same first insulating layer, a gap is provided between the second insulating layer and the conductive layer, and
wherein, on the same first insulating layer, the third insulating layer is provided in the gap between the second insulating layer and the conductive layer.

2. The semiconductor device according to claim 1, wherein:
each of the first and third insulating layers is an oxidation layer, and
the second insulating layer is a nitride film.

3. The semiconductor device according to claim 1, wherein at least one of the conductive layers is tungsten or doped silicon.

4. The semiconductor device according to claim 1, wherein the third insulating layer is embedded in the gap, and differs in material from the first insulating layer.

5. The semiconductor device according to claim 1, wherein the third insulating layer is a silicon oxide film.

6. The semiconductor device according to claim 1, wherein the second insulating layer is formed on at least part of a tread surface of the staircase portion.

7. A method for manufacturing a semiconductor device, the method comprising:
- forming a stacked body by alternately stacking first insulating layers and second insulating layers above a substrate;
- processing at least one side of the stacked body in a staircase pattern to form a staircase portion such that the second insulating layer remains on a tread surface of each stair;
- partially removing the second insulating layer situated in a corner between a riser of the staircase portion and the tread surface of a stair under the riser;
- forming a third insulating layer on the staircase portion;
- substituting the second insulating layer situated under the first insulating layer with a conductive layer while causing the second insulating layer remaining on the tread surface portion to remain; and
- forming contacts penetrating the third insulating layer, the second insulating layer, and the first insulating layer on the staircase portion and leading from an upper surface of the third insulating layer to the conductive layer under the first insulating layer,
- forming a gap between the second insulating layer and the conductive layer on the same first insulating layer, and providing, on the same first insulating layer, the third insulating layer in the gap between the second insulating layer and the conductive layer.

8. The method for manufacturing a semiconductor device according to claim 7, wherein the gap is formed by partially removing the second insulating layer situated in the corner.

9. The method according to claim 7, wherein the third insulating layer differs in material from the second insulating layer.

10. The method according to claim 7, wherein:
- each of the first and third insulating layers is an oxidation layer, and
- the second insulating layer is a nitride film.

11. The method according to claim 7, wherein at least one of the conductive layers is tungsten or doped silicon.

12. The method according to claim 7, wherein the third insulating layer differs in material from the first insulating layer.

13. The method according to claim 7, wherein the third insulating layer is a silicon oxide film.

14. The method according to claim 7, further comprising forming the second insulating layer on at least part of a tread surface of the staircase portion.

15. The method according to claim 7, wherein the second insulating layer at an upper stair of the staircase portion is thicker than the second insulating layer at a lower stair of the staircase portion.

* * * * *